(12) United States Patent
Maes et al.

(10) Patent No.: US 12,068,156 B2
(45) Date of Patent: *Aug. 20, 2024

(54) SELECTIVE DEPOSITION OF SiOC THIN FILMS

(71) Applicant: ASM IP HOLDING B.V., Almere (NL)

(72) Inventors: Jan Willem Maes, Leuven (BE); David Kurt de Roest, Leuven (BE); Oreste Madia, Leuven (BE)

(73) Assignee: ASM IP Holding B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/305,875

(22) Filed: Apr. 24, 2023

(65) Prior Publication Data

US 2023/0260782 A1    Aug. 17, 2023

Related U.S. Application Data

(63) Continuation of application No. 17/463,813, filed on Sep. 1, 2021, now Pat. No. 11,664,219, which is a continuation of application No. 17/064,865, filed on Oct. 7, 2020, now Pat. No. 11,139,163.

(60) Provisional application No. 62/928,978, filed on Oct. 31, 2019.

(51) Int. Cl.
   *H01L 21/02* (2006.01)
   *H01L 21/311* (2006.01)

(52) U.S. Cl.
   CPC .... *H01L 21/0228* (2013.01); *H01L 21/02126* (2013.01); *H01L 21/02211* (2013.01); *H01L 21/02274* (2013.01); *H01L 21/31116* (2013.01)

(58) Field of Classification Search
   None
   See application file for complete search history.

(56) References Cited

U.S. PATENT DOCUMENTS

| | | | |
|---|---|---|---|
| 4,804,640 | A | 2/1989 | Kaganowicz |
| 4,863,879 | A | 9/1989 | Kwok |
| 4,948,755 | A | 8/1990 | Mo |
| 5,288,697 | A | 2/1994 | Schrepp et al. |

(Continued)

FOREIGN PATENT DOCUMENTS

| | | |
|---|---|---|
| EP | 0469456 A1 | 2/1992 |
| EP | 0880168 A2 | 11/1998 |

(Continued)

OTHER PUBLICATIONS

Aaltonen et al., "Atomic Layer Deposition of Iridium Thin Films", Journal of The Electrochemical Society, 151 (8) G489-G492 (2004).

(Continued)

*Primary Examiner* — Roberts P Culbert
(74) *Attorney, Agent, or Firm* — Banner & Witcoff, Ltd.

(57) ABSTRACT

Methods for selectively depositing silicon oxycarbide (SiOC) thin films on a dielectric surface of a substrate relative to a metal surface without generating significant overhangs of SiOC on the metal surface are provided. The methods can include at least one plasma enhanced atomic layer deposition (PEALD) cycle including alternately and sequentially contacting the substrate with a silicon precursor, a first Ar and $H_2$ plasma, a second Ar plasma and an etchant.

20 Claims, 4 Drawing Sheets

(56) References Cited

U.S. PATENT DOCUMENTS

| | | |
|---|---|---|
| 5,447,887 A | 9/1995 | Filipiak et al. |
| 5,604,153 A | 2/1997 | Tsubouchi et al. |
| 5,633,036 A | 5/1997 | Seebauer et al. |
| 5,869,135 A | 2/1999 | Vaeth et al. |
| 5,925,494 A | 7/1999 | Horn |
| 6,046,108 A | 4/2000 | Liu et al. |
| 6,416,577 B1 | 7/2002 | Suntoloa et al. |
| 6,426,015 B1 | 7/2002 | Xia et al. |
| 6,455,414 B1 | 9/2002 | Hillman et al. |
| 6,482,740 B2 | 11/2002 | Soininen et al. |
| 6,586,330 B1 | 7/2003 | Ludviksson et al. |
| 6,679,951 B2 | 1/2004 | Soininen et al. |
| 6,759,325 B2 | 7/2004 | Raaijmakers et al. |
| 6,811,448 B1 | 11/2004 | Paton |
| 6,844,258 B1 | 1/2005 | Fair et al. |
| 6,852,635 B2 | 2/2005 | Satta et al. |
| 6,858,533 B2 | 2/2005 | Chu et al. |
| 6,878,628 B2 | 4/2005 | Sophie et al. |
| 6,887,795 B2 | 5/2005 | Soininen et al. |
| 6,921,712 B2 | 7/2005 | Soininen et al. |
| 6,958,174 B1 | 10/2005 | Klaus et al. |
| 7,041,609 B2 | 5/2006 | Vaartstra |
| 7,067,407 B2 | 6/2006 | Kostamo et al. |
| 7,084,060 B1 | 8/2006 | Furukawa et al. |
| 7,118,779 B2 | 10/2006 | Verghese et al. |
| 7,220,669 B2 | 5/2007 | Hujanen et al. |
| 7,241,677 B2 | 7/2007 | Soininen et al. |
| 7,323,411 B1 | 1/2008 | Blosse |
| 7,405,143 B2 | 7/2008 | Leinikka et al. |
| 7,425,350 B2 | 9/2008 | Todd |
| 7,476,618 B2 | 1/2009 | Kilpela et al. |
| 7,494,927 B2 | 2/2009 | Kostamo et al. |
| 7,595,271 B2 | 9/2009 | White |
| 7,611,751 B2 | 11/2009 | Elers |
| 7,695,567 B2 | 4/2010 | Fu |
| 7,754,621 B2 | 7/2010 | Putkonen |
| 7,790,631 B2 | 9/2010 | Sharma et al. |
| 7,799,135 B2 | 9/2010 | Verghese et al. |
| 7,910,177 B2 | 3/2011 | Li |
| 7,914,847 B2 | 3/2011 | Verghese et al. |
| 7,927,942 B2 | 4/2011 | Raaijmakers |
| 7,951,637 B2 | 5/2011 | Weidman et al. |
| 7,955,979 B2 | 6/2011 | Kostamo et al. |
| 7,964,505 B2 | 6/2011 | Khandelwal et al. |
| 8,173,554 B2 | 5/2012 | Lee et al. |
| 8,293,597 B2 | 10/2012 | Raaijmakers |
| 8,293,658 B2 | 10/2012 | Shero et al. |
| 8,425,739 B1 | 4/2013 | Wieting |
| 8,466,052 B2 | 6/2013 | Baek et al. |
| 8,536,058 B2 | 9/2013 | Kostamo et al. |
| 8,623,468 B2 | 1/2014 | Lin et al. |
| 8,778,815 B2 | 7/2014 | Yamaguchi et al. |
| 8,890,264 B2 | 11/2014 | Dewey et al. |
| 8,956,971 B2 | 2/2015 | Haukka et al. |
| 8,962,482 B2 | 2/2015 | Albertson et al. |
| 8,980,418 B2 | 3/2015 | Darling et al. |
| 8,993,404 B2 | 3/2015 | Korbrinsky et al. |
| 9,067,958 B2 | 6/2015 | Romero |
| 9,112,003 B2 | 8/2015 | Haukka et al. |
| 9,129,897 B2 | 9/2015 | Pore et al. |
| 9,136,110 B2 | 9/2015 | Rathsack |
| 9,159,558 B2 | 10/2015 | Cheng et al. |
| 9,236,292 B2 | 1/2016 | Romero et al. |
| 9,257,303 B2 | 2/2016 | Haukka et al. |
| 9,312,131 B2 | 4/2016 | Bauer et al. |
| 9,349,687 B1 | 5/2016 | Gates et al. |
| 9,353,139 B2 | 5/2016 | Sundermeyer et al. |
| 9,455,138 B1 | 9/2016 | Fukazawa et al. |
| 9,490,145 B2 | 11/2016 | Niskanen et al. |
| 9,502,289 B2 | 11/2016 | Haukka et al. |
| 9,552,979 B2 | 1/2017 | Knaepen et al. |
| 9,679,808 B2 | 6/2017 | Haukka et al. |
| 9,786,491 B2 | 10/2017 | Suzuki et al. |
| 9,786,492 B2 | 10/2017 | Suzuki et al. |
| 9,803,277 B1 | 10/2017 | Longrie et al. |
| 9,805,974 B1 | 10/2017 | Chen et al. |
| 9,816,180 B2 | 11/2017 | Haukka et al. |
| 9,895,715 B2 | 2/2018 | Haukka et al. |
| 9,911,595 B1 | 3/2018 | Smith et al. |
| 10,014,212 B2 | 7/2018 | Chen et al. |
| 10,041,166 B2 | 8/2018 | Longrie et al. |
| 10,047,435 B2 | 8/2018 | Haukka et al. |
| 10,049,924 B2 | 8/2018 | Haukka et al. |
| 10,115,603 B2 | 10/2018 | Niskanen et al. |
| 10,157,786 B2 | 12/2018 | Haukka et al. |
| 10,186,420 B2 | 1/2019 | Fukazawa |
| 10,204,782 B2 | 2/2019 | Maes et al. |
| 10,325,773 B2 | 6/2019 | Varadarajan et al. |
| 10,343,186 B2 | 7/2019 | Pore et al. |
| 10,373,820 B2 | 8/2019 | Tois et al. |
| 10,428,421 B2 | 10/2019 | Haukka et al. |
| 10,443,123 B2 | 10/2019 | Haukka et al. |
| 10,453,701 B2 | 10/2019 | Tois et al. |
| 10,480,064 B2 | 11/2019 | Longrie et al. |
| 10,546,741 B2 | 1/2020 | Muramaki et al. |
| 10,600,637 B2 | 3/2020 | Suzuki et al. |
| 10,695,794 B2 | 6/2020 | Pore et al. |
| 10,847,363 B2 | 11/2020 | Tapily |
| 10,900,120 B2 | 1/2021 | Sharma et al. |
| 10,991,573 B2 | 4/2021 | Jia et al. |
| 2001/0019803 A1 | 9/2001 | Mirkanimi |
| 2001/0021414 A1 | 9/2001 | Morishima et al. |
| 2001/0025205 A1 | 9/2001 | Chern et al. |
| 2002/0027261 A1 | 3/2002 | Blesser et al. |
| 2002/0047144 A1 | 4/2002 | Nguyen et al. |
| 2002/0068458 A1 | 6/2002 | Chiang et al. |
| 2002/0090777 A1 | 7/2002 | Forbes et al. |
| 2002/0107316 A1 | 8/2002 | Bice et al. |
| 2003/0027431 A1 | 2/2003 | Sneh et al. |
| 2003/0066487 A1 | 4/2003 | Suzuki |
| 2003/0143839 A1 | 7/2003 | Raaijmakers et al. |
| 2003/0176559 A1 | 9/2003 | Bice et al. |
| 2003/0181035 A1 | 9/2003 | Yoon et al. |
| 2003/0185997 A1 | 10/2003 | Hsieh |
| 2003/0192090 P1 | 10/2003 | Meilland |
| 2003/0193090 A1 | 10/2003 | Otani et al. |
| 2004/0092073 A1 | 5/2004 | Cabral |
| 2004/0129558 A1 | 7/2004 | Liu et al. |
| 2004/0219746 A1 | 11/2004 | Vaartstra et al. |
| 2005/0012975 A1 | 1/2005 | George et al. |
| 2005/0136604 A1 | 6/2005 | Al-Bayati et al. |
| 2005/0160575 A1 | 7/2005 | Gambino et al. |
| 2005/0223989 A1 | 10/2005 | Lee et al. |
| 2006/0019493 A1 | 1/2006 | Li |
| 2006/0047132 A1 | 3/2006 | Shenai-Khatkhate et al. |
| 2006/0121271 A1 | 6/2006 | Frey et al. |
| 2006/0121677 A1 | 6/2006 | Parekh et al. |
| 2006/0121733 A1 | 6/2006 | Kilpela et al. |
| 2006/0128150 A1 | 6/2006 | Gandikota et al. |
| 2006/0141155 A1 | 6/2006 | Gordon et al. |
| 2006/0156979 A1 | 7/2006 | Thakur et al. |
| 2006/0176559 A1 | 8/2006 | Minoda et al. |
| 2006/0199399 A1 | 9/2006 | Muscat |
| 2006/0226409 A1 | 10/2006 | Burr et al. |
| 2006/0292845 A1 | 12/2006 | Chiang et al. |
| 2007/0014919 A1 | 1/2007 | Hamalainen et al. |
| 2007/0026654 A1 | 2/2007 | Huotari et al. |
| 2007/0036892 A1 | 2/2007 | Haukka et al. |
| 2007/0063317 A1 | 3/2007 | Kim et al. |
| 2007/0098894 A1 | 5/2007 | Verghese et al. |
| 2007/0099422 A1 | 5/2007 | Wijekoon et al. |
| 2007/0232082 A1 | 10/2007 | Balseanu et al. |
| 2007/0241390 A1 | 10/2007 | Tanaka et al. |
| 2007/0251444 A1 | 11/2007 | Gros-Jean et al. |
| 2007/0292604 A1 | 12/2007 | Dordi et al. |
| 2008/0066680 A1 | 3/2008 | Sherman |
| 2008/0072819 A1 | 3/2008 | Rahtu |
| 2008/0124932 A1 | 5/2008 | Tateishi et al. |
| 2008/0179741 A1 | 7/2008 | Streck et al. |
| 2008/0241575 A1 | 10/2008 | Lavoie et al. |
| 2008/0282970 A1 | 11/2008 | Heys et al. |
| 2009/0035949 A1 | 2/2009 | Niinisto et al. |
| 2009/0071505 A1 | 3/2009 | Miya et al. |
| 2009/0081385 A1 | 3/2009 | Heys et al. |

(56) References Cited

U.S. PATENT DOCUMENTS

| | | |
|---|---|---|
| 2009/0203222 A1 | 8/2009 | Dussarrat et al. |
| 2009/0269507 A1 | 10/2009 | Yu et al. |
| 2009/0274887 A1 | 11/2009 | Millward et al. |
| 2009/0275163 A1 | 11/2009 | Lacey et al. |
| 2009/0311879 A1 | 12/2009 | Blasco et al. |
| 2010/0015756 A1 | 1/2010 | Weidman et al. |
| 2010/0102417 A1 | 4/2010 | Ganguli et al. |
| 2010/0147396 A1 | 6/2010 | Yamagishi et al. |
| 2010/0178468 A1 | 7/2010 | Jiang et al. |
| 2010/0248473 A1 | 9/2010 | Ishizaka et al. |
| 2010/0270626 A1 | 10/2010 | Raisanen |
| 2010/0297474 A1 | 11/2010 | Dameron |
| 2010/0314765 A1 | 12/2010 | Liang et al. |
| 2011/0039420 A1 | 2/2011 | Nakao |
| 2011/0053800 A1 | 3/2011 | Jung et al. |
| 2011/0120542 A1 | 5/2011 | Levy |
| 2011/0124192 A1 | 5/2011 | Ganguli et al. |
| 2011/0146568 A1 | 6/2011 | Haukka et al. |
| 2011/0146703 A1 | 6/2011 | Chen et al. |
| 2011/0198756 A1 | 8/2011 | Thenappan et al. |
| 2011/0221061 A1 | 9/2011 | Prakash |
| 2011/0244680 A1 | 10/2011 | Tohnoe et al. |
| 2011/0311726 A1 | 12/2011 | Liu et al. |
| 2012/0032311 A1 | 2/2012 | Gates |
| 2012/0046421 A1 | 2/2012 | Darling et al. |
| 2012/0052681 A1 | 3/2012 | Marsh |
| 2012/0088369 A1 | 4/2012 | Weidman et al. |
| 2012/0091541 A1 | 4/2012 | Suchomel et al. |
| 2012/0189868 A1 | 7/2012 | Borovik et al. |
| 2012/0219824 A1 | 8/2012 | Prolier et al. |
| 2012/0241411 A1 | 9/2012 | Darling et al. |
| 2012/0264291 A1 | 10/2012 | Ganguli et al. |
| 2012/0269970 A1 | 10/2012 | Ido et al. |
| 2013/0005133 A1 | 1/2013 | Lee et al. |
| 2013/0078793 A1 | 3/2013 | Sun et al. |
| 2013/0084700 A1 | 4/2013 | Swerts et al. |
| 2013/0089983 A1 | 4/2013 | Sugita et al. |
| 2013/0095664 A1 | 4/2013 | Matero et al. |
| 2013/0115763 A1 | 5/2013 | Takamure et al. |
| 2013/0115768 A1 | 5/2013 | Pore et al. |
| 2013/0126815 A1 | 5/2013 | Kim et al. |
| 2013/0143401 A1 | 6/2013 | Yu et al. |
| 2013/0146881 A1 | 6/2013 | Yamazaki et al. |
| 2013/0157409 A1 | 6/2013 | Vaidya et al. |
| 2013/0189790 A1 | 7/2013 | Li et al. |
| 2013/0189837 A1 | 7/2013 | Haukka et al. |
| 2013/0196502 A1 | 8/2013 | Haukka et al. |
| 2013/0203267 A1 | 8/2013 | Pomarede et al. |
| 2013/0280919 A1 | 10/2013 | Yuasa et al. |
| 2013/0284094 A1 | 10/2013 | Pavol et al. |
| 2013/0309457 A1 | 11/2013 | Rathsack et al. |
| 2013/0316080 A1 | 11/2013 | Yamaguchi et al. |
| 2013/0319290 A1 | 12/2013 | Xiao et al. |
| 2013/0323930 A1 | 12/2013 | Chattopadhyay et al. |
| 2014/0001572 A1 | 1/2014 | Bohr et al. |
| 2014/0024200 A1 | 1/2014 | Kato et al. |
| 2014/0091308 A1 | 4/2014 | Dasgupta et al. |
| 2014/0120738 A1 | 5/2014 | Jung et al. |
| 2014/0152383 A1 | 6/2014 | Nikonov et al. |
| 2014/0190409 A1 | 7/2014 | Matsumoto et al. |
| 2014/0193598 A1 | 7/2014 | Traser et al. |
| 2014/0205766 A1 | 7/2014 | Lyon et al. |
| 2014/0209022 A1 | 7/2014 | Inoue et al. |
| 2014/0227461 A1 | 8/2014 | Darwish et al. |
| 2014/0252487 A1 | 9/2014 | Stephens et al. |
| 2014/0272194 A1 | 9/2014 | Xiao et al. |
| 2014/0273290 A1 | 9/2014 | Somervell |
| 2014/0273477 A1 | 9/2014 | Niskanen et al. |
| 2014/0273514 A1 | 9/2014 | Somervell et al. |
| 2014/0273523 A1 | 9/2014 | Rathsack |
| 2014/0273527 A1 | 9/2014 | Niskanen et al. |
| 2015/0004317 A1 | 1/2015 | Dussarrat et al. |
| 2015/0004319 A1 | 1/2015 | Mizue |
| 2015/0004806 A1 | 1/2015 | Ndiege et al. |
| 2015/0011032 A1 | 1/2015 | Kunimatsu et al. |
| 2015/0011093 A1 | 1/2015 | Singh et al. |
| 2015/0037972 A1 | 2/2015 | Danek et al. |
| 2015/0064931 A1 | 3/2015 | Kumagi et al. |
| 2015/0083415 A1 | 3/2015 | Monroe et al. |
| 2015/0087158 A1 | 3/2015 | Sugita et al. |
| 2015/0093890 A1 | 4/2015 | Blackwell et al. |
| 2015/0097292 A1 | 4/2015 | He et al. |
| 2015/0118863 A1 | 4/2015 | Rathod et al. |
| 2015/0162214 A1 | 6/2015 | Thompson et al. |
| 2015/0170961 A1 | 6/2015 | Romero et al. |
| 2015/0179798 A1 | 6/2015 | Clendenning et al. |
| 2015/0217330 A1 | 8/2015 | Haukka et al. |
| 2015/0240121 A1 | 8/2015 | Sugita et al. |
| 2015/0275355 A1 | 10/2015 | Mallikarjunan et al. |
| 2015/0299848 A1 | 10/2015 | Haukka et al. |
| 2015/0371866 A1 | 12/2015 | Chen et al. |
| 2015/0372205 A1 | 12/2015 | Kimura et al. |
| 2015/0376211 A1 | 12/2015 | Girard et al. |
| 2016/0075884 A1 | 3/2016 | Chen |
| 2016/0079524 A1 | 3/2016 | Do et al. |
| 2016/0086850 A1 | 3/2016 | Romero et al. |
| 2016/0152640 A1 | 6/2016 | Kuchenbeiser et al. |
| 2016/0172189 A1 | 6/2016 | Tapily |
| 2016/0186004 A1 | 6/2016 | Hustad et al. |
| 2016/0190060 A1 | 6/2016 | Bristol et al. |
| 2016/0222504 A1 | 8/2016 | Haukka et al. |
| 2016/0247695 A1 | 8/2016 | Niskanen et al. |
| 2016/0276208 A1 | 9/2016 | Haukka et al. |
| 2016/0284568 A1 | 9/2016 | Morris et al. |
| 2016/0293384 A1 | 10/2016 | Yan et al. |
| 2016/0293398 A1 | 10/2016 | Danek et al. |
| 2016/0315191 A1 | 10/2016 | Tsai et al. |
| 2016/0346838 A1 | 12/2016 | Fujita et al. |
| 2016/0365280 A1 | 12/2016 | Brink et al. |
| 2017/0037513 A1 | 2/2017 | Haukka et al. |
| 2017/0040164 A1 | 2/2017 | Wang et al. |
| 2017/0051405 A1 | 2/2017 | Fukazawa et al. |
| 2017/0058401 A1 | 3/2017 | Blackwell et al. |
| 2017/0069527 A1 | 3/2017 | Haukka et al. |
| 2017/0098575 A1* | 4/2017 | Kesapragada .......... H01L 21/32 |
| 2017/0100742 A1 | 4/2017 | Pore et al. |
| 2017/0100743 A1 | 4/2017 | Pore et al. |
| 2017/0107413 A1 | 4/2017 | Wang et al. |
| 2017/0154806 A1 | 6/2017 | Wang et al. |
| 2017/0298503 A1 | 10/2017 | Maes et al. |
| 2017/0301542 A1 | 10/2017 | Maes et al. |
| 2017/0323776 A1 | 11/2017 | Färm et al. |
| 2017/0323782 A1 | 11/2017 | Suzuki et al. |
| 2017/0332179 A1 | 11/2017 | Bright et al. |
| 2017/0352533 A1 | 12/2017 | Tois et al. |
| 2017/0352550 A1 | 12/2017 | Tois et al. |
| 2017/0358482 A1 | 12/2017 | Chen et al. |
| 2018/0010247 A1 | 1/2018 | Niskanen et al. |
| 2018/0040708 A1 | 2/2018 | Narayanan et al. |
| 2018/0073136 A1 | 3/2018 | Haukka et al. |
| 2018/0080121 A1 | 3/2018 | Longrie et al. |
| 2018/0096888 A1 | 4/2018 | Naik et al. |
| 2018/0142348 A1 | 5/2018 | Yu et al. |
| 2018/0151345 A1 | 5/2018 | Haukka et al. |
| 2018/0151355 A1 | 5/2018 | Fukazawa |
| 2018/0182618 A1 | 6/2018 | Blanquart et al. |
| 2018/0222933 A1 | 8/2018 | Romero |
| 2018/0233350 A1 | 8/2018 | Tois et al. |
| 2018/0243787 A1 | 8/2018 | Haukka et al. |
| 2019/0017170 A1 | 1/2019 | Sharma et al. |
| 2019/0057858 A1 | 2/2019 | Hausmann et al. |
| 2019/0074441 A1 | 3/2019 | Kikuchi et al. |
| 2019/0100837 A1 | 4/2019 | Haukka et al. |
| 2019/0155159 A1 | 5/2019 | Knaepen et al. |
| 2019/0283077 A1 | 9/2019 | Pore et al. |
| 2019/0333761 A1 | 10/2019 | Tois et al. |
| 2019/0341245 A1 | 11/2019 | Tois et al. |
| 2020/0051829 A1 | 2/2020 | Tois et al. |
| 2020/0105515 A1 | 4/2020 | Maes et al. |

FOREIGN PATENT DOCUMENTS

| | | |
|---|---|---|
| EP | 1340269 | 2/2009 |
| EP | 3026055 | 6/2016 |

(56) References Cited

FOREIGN PATENT DOCUMENTS

| JP | 2001127068 | 5/2001 |
|---|---|---|
| JP | 2008311603 | 12/2008 |
| JP | 2011018742 | 1/2011 |
| JP | 2011-187583 | 9/2011 |
| JP | 2014-93331 | 5/2014 |
| KR | 102001001072 | 2/2001 |
| KR | 1020020010821 | 2/2002 |
| KR | 20030027392 | 4/2003 |
| KR | 1020040056026 | 6/2004 |
| KR | 1020050103811 | 11/2005 |
| KR | 10-0920033 | 10/2009 |
| TW | 2005-39321 | 12/2005 |
| TW | 2010-05827 | 2/2010 |
| TW | 2014-39365 | 10/2014 |
| WO | WO 2002/045167 | 6/2002 |
| WO | WO 2011/156705 | 12/2011 |
| WO | WO 2013/161772 | 10/2013 |
| WO | WO 2014/156782 | 10/2014 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |
| WO | WO 2016/178978 | 11/2016 |
| WO | WO 2017/184357 | 10/2017 |
| WO | WO 2017/184358 | 10/2017 |
| WO | WO 2018/204709 | 11/2018 |
| WO | WO 2018/213018 | 11/2018 |

OTHER PUBLICATIONS

Au et al., "Selective Chemical Vapor Deposition of Manganese Self-Aligned Capping Layer for Cu Interconnections in Microelectronics", Journal of the Electrochemical Society, vol. 157, No. 6, 2010, pp. D341-D345.
Benzotriazole, Wikipedia via https://en.wikipedia.org/wiki/Benzotriazole; pp. 1-5, no date available.
Bernal-Ramos, et al., "Atomic Layer Deposition of Cobalt Silicide Thin Films Studied by in Situ Infrared Spectroscopy", Chem. Mater. 2015, 27, pp. 4943-4949.
Bouteville et al., "Selective R.T.L.P.C.V.D. of Tungsten by Silane Reduction on Patterned PPQ/Si Wafers" Journal De Physique IV, Colloque C2, suppl. au Journal de Physique II, vol. 1, Sep. 1991, pp. C2-857-C2-864.
Burton, B.B. et al., "Atomic Layer Deposition of MgO Using Bis(ethylcyclopentadienyl)magnesium and H20". J. Phys. Chem. C, 2009, 113, 1939-1946.
Burton, B.B., et al., "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.
Carlsson, J., "Precursor Design for Chemical Vapour Deposition", Acta Chemica Scandinavica, vol. 45, 1991, pp. 864-869.
Chang et al., "Influences of damage and contamination from reactive ion etching on selective tungsten deposition in a low-pressure chemical-vapor-deposition reactor", J. Appl. Phys., vol. 80, No. 5, Sep. 1, 1996, pp. 3056-3061.
Chen et al., Highly Stable Monolayer Resists for Atomic Layer Deposition on Germanium and Silicon, Chem. Matter, vol. 18, No. 16, pp. 3733-3741, 2006.
Cho et al., "Atomic layer deposition of Al2O3 thin films using dimethylaluminum isopropoxide and water", Journal of Vacuum Science & Technology A 21, (2003), doi: 10.1116/1.1562184, pp. 1366-1370.
Coclite, et al.; 25th Anniversary Article: CVD Polymers: A New Paradigm for Surface Modification and Device Fabrication; Advanced Materials; Oct. 2013; 25; pp. 5392-5423.
Elam et al., "Kinetics of the WF6 and Si2H6 surface reactions during tungsten atomic layer deposition", Surface Science, vol. 479, 2001, pp. 121-135.
Elam et al., "Nucleation and growth during tungsten atomic layer deposition on SiO2 surfaces", Thin Solid Films, vol. 386, 2001 pp. 41-52.
Ellinger et al., "Selective Area Spatial Atomic Layer Deposition of ZnO, Al2O3, and Aluminum-Doped ZnO Using Poly(vinyl pyrrolidone)", Chem. Mater. 2014, 26, pp. 1514-1522.
Fabreguette et al., Quartz crystal microbalance study of tungsten atomic layer deposition using WF6 and Si2H6, Thin Solid Films, vol. 488, 2005, pp. 103-110.
Farm et al. Selective-Area Atomic Layer Deposition Using Poly( methyl methacrylate) Films as Mask Layers, J. Phys. Chem. C, 2008, 112, pp. 15791-15795. (Year: 2008).
Farm et al., "Self-Assembled Octadecyltrimethoxysilane Monolayers Enabling Selective-Area Atomic Layer Deposition of Iridium", Chem. Vap. Deposition, 2006, 12, pp. 415-417.
Farr, Isaac Vincent; Synthesis and Characterization of Novel Polyimide Gas Separation Membrane Material Systems, Chapter 2; Virginia Tech Chemistry PhD Dissertation; URN# etd-080999-123034; Jul. 26, 1999.
File History of U.S. Appl. No. 14/612,784, filed Feb. 3, 2015.
File History of U.S. Appl. No. 15/877,632, filed Jan. 23, 2018.
File History of U.S. Appl. No. 16/657,307, filed Oct. 18, 2019.
File History of U.S. Appl. No. 14/687,833, filed Apr. 15, 2015.
File History of U.S. Appl. No. 16/100,855, filed Aug. 10, 2018.
File History of U.S. Appl. No. 16/594,365, filed Oct. 7, 2019.
File History of U.S. Appl. No. 14/628,799, filed Feb. 23, 2015.
File History of U.S. Appl. No. 15/331,366, filed Oct. 21, 2016.
File History of U.S. Appl. No. 16/143,888, filed Sep. 27, 2018.
File History of U.S. Appl. No. 16/987,990, filed Aug. 7, 2020.
File History of U.S. Appl. No. 14/817,161, filed Aug. 3, 2015.
File History of U.S. Appl. No. 14/819,274, filed Aug. 5, 2015.
File History of U.S. Appl. No. 16/787,672, filed Feb. 11, 2020.
File History of U.S. Appl. No. 15/432,263, filed Feb. 14, 2017.
File History of U.S. Appl. No. 16/158,780, filed Oct. 12, 2018.
File History of U.S. Appl. No. 16/773,064, filed Jan. 27, 2020.
File History of U.S. Appl. No. 15/221,453, filed Jul. 27, 2016.
File History of U.S. Appl. No. 16/575, 112, filed Sep. 18, 2019.
File History of U.S. Appl. No. 15/177,195, filed Jun. 8, 2016.
File History of U.S. Appl. No. 15/795,768, filed Oct. 27, 2017.
File History of U.S. Appl. No. 16/040,844, filed Jul. 20, 2018.
File History of U.S. Appl. No. 16/676,017, filed Nov. 6, 2019.
File History of U.S. Appl. No. 15/581,726, filed Apr. 28, 2017.
File History of U.S. Appl. No. 15/364,024, filed Nov. 29, 2016.
File History of U.S. Appl. No. 15/892,728, filed Feb. 9, 2018.
File History of U.S. Appl. No. 16/605,475, filed Oct. 15, 2019.
File History of U.S. Appl. No. 16/033,952, filed Jul. 12, 2018.
File History of U.S. Appl. No. 17/135,001, filed Dec. 28, 2020.
File History of U.S. Appl. No. 16/399,328, filed Apr. 30, 2019.
File History of U.S. Appl. No. 17/113,383, filed Dec. 7, 2020.
File History of U.S. Appl. No. 15/971,601, filed May 4, 2018.
File History of U.S. Appl. No. 16/588,600, filed Sep. 30, 2019.
File History of U.S. Appl. No. 16/836, 151, filed Mar. 31, 2020.
File History of U.S. Appl. No. 13/708,863, filed Dec. 7, 2012.
File History of U.S. Appl. No. 14/737,293, filed Jun. 11, 2015.
File History of U.S. Appl. No. 15/356,306, filed Nov. 18, 2016.
File History of U.S. Appl. No. 16/213,479, filed Dec. 7, 2018.
File History of U.S. Appl. No. 13/702,992, filed Mar. 26, 2013.
File History of U.S. Appl. No. 14/613,183, filed Feb. 3, 2015.
File History of U.S. Appl. No. 14/988,374, filed Jan. 5, 2016.
File History of U.S. Appl. No. 15/609,497, filed May 31, 2017.
File History of U.S. Appl. No. 16/100,581, filed Aug. 10, 2018.
Formic Acid, Wikipedia via https://en.wikipedia.org/wiki/Formic_acid; pp. 1-5, no date available.
George, Steven M., "Atomic Layer Deposition: An Overview", Chem. Rev. 2010, 110, pp. 111-113.
Ghosal et al., Controlling Atomic Layer Deposition of TiO2 in Aerogels through Surface Functionalization, Chem. Matter, vol. 21, pp. 1989-1992, 2009.
Grubbs et al., "Nucleation and growth during the atomic layer deposition of W on Al2O3 and Al2O3 on W", Thin Solid Films, vol. 467, 2004, pp. 16-27.

(56) References Cited

OTHER PUBLICATIONS

Hashemi et al., "A New Resist for Area Selective Atomic and Molecular Layer Deposition on Metal-Dielectric Patterns", J. Phys. Chem. C 2014, 118, p. 10957-10962.
Hashemi et al., "Selective Deposition of Dieletrics: Limits and Advantages of Alkanethiol Blocking Agents on Metal-Dielectric Patterns", ACS Appl. Mater. Interfaces 2016, 8, pp. 33264-33272.
Hu et al. "Coating strategies for atomic layer deposition", Nanotechnol. Rev. 2017; 6(6): pp. 527-547.
Hymes et al., "Surface cleaning of copper by thermal and plasma treatment in reducing and inert ambients", J. Vac. Sci. Technol. B, vol. 16, No. 3, May/Jun. 1998, pp. 1107-1109.
International Search Report and Written Opinion dated Feb. 17, 2012 in Application No. PCT/US2011/039970, filed Jun. 10, 2011.
International Search Report and Written Opinion dated Aug. 8, 2018 in Application No. PCT/US2018/030974, filed May 3, 2018.
International Search Report and Written Opinion dated Jul. 24, 2018 in Application No. PCT/US2018/030979, filed May 3, 2018.
Klaus et al., "Atomic layer deposition of tungsten using sequential surface chemistry with a sacrificial stripping reaction", Thin Solid Films, vol. 360, 2000, pp. 145-153.
Klaus et al., "Atomically controlled growth of tungsten and tungsten nitride using sequential surface reactions", Applied Surface Science 162-163, 2000, pp. 479-491.
King, "Dielectric Barrier, Etch Stop, and Metal Capping Materials for State of the Art and beyond Metal Interconnects", ECS Journal of Solid State Science and Technology, vol. 4, Issue 1, pp. N3029-N3047, 2015.
Kukli et al., "Properties of hafnium oxide films grown by atomic layer deposition from hafnium tetraiodide and oxygen", J. Appl. Phys., vol. 92, No. 10, Nov. 15, 2002, pp. 5698-5703.
Lecordier et al., "Vapor-deposited octadecanethlol masking layer on copper to enable area selective Hf3N4 atomic layer deposition on dielectrics studied by in situ spectroscopic ellipsometry", J. Vac. Sci. Technol. A36(3), May/Jun. 2018, p. 031605-1-031605-8.
Lee et al., Area-Selective Atomic Layer Deposition Using Self-Assembled Monolayer and Scanning Probe Lithography, Journal of The Electrochemical Society, vol. 156, Issue 9, pp. G125-G128, 2009.
Lei et al., "Real-time observation and opitimization of tungsten atomic layer deposition process cycle", J. Vac. Sci. Technol. B, vol. 24, No. 2, Mar./Apr. 2006, pp. 780-789.
Lemonds, Andrew Michael, "Atomic Layer Deposition and Properties of Refractory Transition Metal-Based Copper-Diffusion Barriers for ULSI Interconnect", The University of Texas at Austin, 2003, pp. 1-197.
Lemonds, A.M., "Atomic layer deposition of TaSix thin films on SiO2 using TaF5 and Si2H6", Thin Solid Films 488, 2005 pp. 9-14.
Leusink et al., "Growth kinetics and inhibition of growth of chemical vapor deposited thin tungsten films on silicon from tungsten hexafluoride", J. Appl. Phys., vol. 72, No. 2, Jul. 15, 1992, pp. 490-498.
Liang, Xuehai, et al., "Growth of Ge Nanofilms Using Electrochemical Atomic Layer Deposition, with a "Bait and Switch" Surface-Limited Reaction". Journal of the American Chemical Society, 2011, 133, 8199-8024.
Lin et al., "Selective Deposition of Multiple Sensing Materials on Si Nanobelt Devices through Plasma-Enhanced Chemical Vapor Deposition and Device-Localized Joule Heating", ACS Appl. Mater. Interfaces 2017, 9, 39935-39939, DOI: 10.1021/acsami.7b13896.
Lohokare et al., "Reactions of Disilane on Cu(111): Direct Observation of Competitive Dissociation, Disproportionation, and Thin Film Growth Processes", Langmuir 1995, vol. 11, pp. 3902-3912.
Low et al., Selective deposition of CVD iron on silicon dioxide and tungsten, Microelectronic Engineering 83, pp. 2229-2233, 2006.
Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.
Mackus et al., Local deposition of high-purity Pt nanostructures by combining electron beam induced deposition and atomic layer deposition, Journal of Applied Physics, vol. 107, pp. 116102-1-116102-3, 2010.
Mackus et al., "The use of atomic layer deposition in advanced nanopatterning", Nanoscale, 2014, 6, pp. 10941-10960.
Maluf et al., "Selective tungsten filling of sub-0.25um trenches for the fabrication of scaled contacts and x-ray masks", J. Vac. Sci. Technol. B, vol. 8, No. 3, May/Jun. 1990, pp. 568-569.
Norrman, et al.; 6 Studies Of Spin-Coated Polymer Films; Annu. Rep. Prag. Chem .; Sect. C; 2005; 101; pp. 174-201.
Office Action dated Jun. 8, 2017 in Korean Application No. 2013-7000596.
Overhage et al., Selective Atomic Layer Deposition (SALD) of Titanium Dioxide on Silicon and Copper Patterned Substrates, Journal of Undergraduate Research 4, 29, Mar. 2011 in 4 pages.
Parulekar et al., Atomic Layer Deposition of Zirconium Oxide on Copper Patterned Silicon Substrate, Journal of Undergraduate Research, vol. 7, pp. 15-17, 2014.
Parulekar et al., Selective atomic layer deposition of zirconium oxide on copper patterned silicon substrate, pp. 1-6, 2013.
Prasittichai et al., "Area Selective Molecular Layer Deposition of Polyurea Film", Applied Materials & Interfaces, 2013, vol. 5, p. 13391-13396.
Proslier et al., "Atomic Layer Deposition and Superconducting Properties of NbSi Films", The Journal of Physical Chemistry C, 2011, vol. 115, No. 50, pp. 1-26.
Putkonen, et al.; Atomic Layer Deposition Of Polyimide Thin Films; Journal of Materials Chemistry; 2007, 17, pp. 664-669.
Ratta, Varun; Crystallization, Morphology, Thermal Stability and Adhesive Properties of Novel High Performance Semicrystalline Polyimides, Chapter 1; Virginia Tech Chemistry PhD Dissertation; URN # etd-051799-162256; Apr. 26, 1999.
Roberts et al., "Selective Mn deposition on Cu lines", poster presentation, 12th International Conference on Atomic Layer Deposition, Jun. 19, 2012, Dresden, Germany.
Sapp, et al.; Thermo-Mechanical and Electrical Characterization of Through-Silicon Vias with a Vapor Deposited Polyimide Dielectric Liner; IEEE; 2012.
Schmeißer, Decomposition of formic acid, Chemnitz University of Technology, pp. 1-13, Aug. 31, 2011.
Schmeißer, Reduction of Copper Oxide by Formic Acid an ab-initio study, Chemnitz University of Technology, pp. 1-42, Sep. 2011.
Selvaraj et al., Selective atomic layer deposition of zirconia on copper patterned silicon substrates using ethanol as oxygen source as well as copper reductant, Journal of Vacuum Science & Technology A, vol. 32, No. 1, pp. 010601-1-010601-4, Jan. 2014.
Senesky et al., "Aluminum nitride as a masking material for the plasma etching of silicon carbide structures," 2010, IEEE, pp. 352-355.
Schuiskly et al., "Atomic Layer Deposition of Thin Films Using O2 as Oxygen Source", Langmuir, vol. 17, No. 18, 2001, pp. 5508-5512.
Sundberg, et al.; Organic And Inorganic-Organic Thin Film Structures By Molecular Layer Deposition: A Review; Beilstein J. Nanotechnol; 2014, 5, pp. 1104-1136.
Suntola, Tuomo, "Thin Films and Epitaxy Part B: Grown mechanism and Dynamics", Handbook of Crystal Growth vol. 3, Elsevier, 1994, 33 pages.
Ting, et al., "Selective Electroless Metal Deposition for Integrated Circuit Fabrication", J. Electrochem. Soc., vol. 136, No. 2, Feb. 1989, pp. 456-462.
Toirov, et al.; Thermal Cyclodehydration of Polyamic Acid Initiated by UV-Irradiation; Iranian Polymer Journal; vol. 5, No. 1; pp. 1A323:C3286-22; 1996; Iran.
"Tungsten and Tungsten Silicide Chemical Vapor Deposition", TimeDomain CVD, Inc., retrieved from link: http://www.timedomaincvd.com/CVD_Fundamentals/films/W_WSi.html, Last modified Jul. 11, 2008.
Yu et al., "Gas/surface reactions in the chemical vapor deposition of tungsten using WF6/SiH4 mixtures", J. Vac. Sci. Technol. A, vol. 7, No. 3, May/Jun. 1989, pp. 625-629.

(56) References Cited

OTHER PUBLICATIONS

Vallat et al., Selective deposition of Ta2O5 by adding plasma etching super-cycles in plasma enhanced atomic layer deposition steps, Journal of Vacuum Science & Technology A, vol. 35, No. 1, pp. 01B104-1-01B104-7, Jan. 2017.

Vervuurt et al., "Area-selective atomic layer deposition of platinum using photosensitive polyimide", Nanotechnology 27, 2016, in 6 pages.

Wang et al., "Low-temperature plasma-enhanced atomic layer deposition of tin oxide electron selective layers for highly efficient planar perovskite solar cells", Journal of Materials Chemistry A, 2016, 4, pp. 12080-12087.

Zhou, et al.; Fabrication of Organic Interfacial Layers by Molecular Layer Deposition: Present Status and Future Opportunities; Journal of Vacuum Science & Technology; A 31 (4), 040801-1 to 040801-18; 2013.

\* cited by examiner

SELECTIVE DEPOSITION OF SiOC THIN FILMS

REFERENCE TO RELATED APPLICATION

The present application is a continuation of U.S. application Ser. No. 17/463,813, filed Sep. 1, 2021, which is a continuation of U.S. application Ser. No. 17/064,865, filed Oct. 7, 2020, now U.S. Pat. No. 11,139,163, which claims priority to U.S. Provisional Application No. 62/928,978, filed Oct. 31, 2019, each of which is incorporated by reference herein.

BACKGROUND

Field

The present disclosure relates generally to the field of semiconductor device manufacturing and, more particularly, to selective deposition of silicon oxycarbide (SiOC) films on dielectric materials.

Description of the Related Art

There is increasing need for dielectric materials with relatively low dielectric constant (k) values and relatively low acid-based wet etch rates. Silicon oxycarbide (SiOC) may satisfy certain of these requirements. Selective deposition of dielectric films like SiOC on a patterned surface, such as on a dielectric surface relative to a metal surface can be advantageous in a number of settings. For example, in the case of the case of self-aligned vias in Back End of Line (BEOL) processing area selective growth of a low k dielectric like SiOC on top of the existing dielectric areas of a BEOL structure is desirable.

One of the challenges with area selective deposition of dielectric materials such as SiOC is overgrowth on the adjacent surfaces, such as on adjacent metal areas. Such overgrowth can, for example, reduce the area available to make a via with a low series resistance on a BEOL structure.

DETAILED DESCRIPTION

Figure 1A:
FIG. 1A and FIG. 1B show a flow diagram utilizing schematic cross sections of a portion of a substrate having first and second surfaces of low-k material and copper, and generally illustrate area selective deposition in which undesirable overgrowth on the metal area is visible (FIG. 1A) and the more desirable deposition in which no deposited material is present on the metal surface (FIG. 1B).
Figure 1B:

Silicon oxycarbide (SiOC) films have a wide variety of applications, for example in integrated circuit fabrication. SiOC films may be useful as, for example, etch stop layers, sacrificial layers, low-k spacers, anti-reflection layers (ARL), and passivation layers. SiOC can be deposited selectively, for example on dielectric or low-k materials relative to metal, as described, for example, in U.S. application Ser. No. 16/588,600, incorporated by reference herein. This can be referred to as area selective deposition. Area selective deposition of SiOC on a flat patterned surface generally proceeds in an isotropic way, resulting in "mushroom" type growth, as is illustrated in FIG. 1A. The deposited material typically grows both vertically and horizontally from the area in which the growth selectively takes place. In many applications this lateral growth is undesirable. Vertical growth is preferred to maintain the dimension of the original structure on which the growth takes place and not to cover the neighboring area, as is shown in FIG. 1B.

In some embodiments, area selective growth of a dielectric, for example a low k dielectric such as SiOC, takes place selectively on a first surface, such as a dielectric or low-k surface, without undesirable levels of overgrowth on a second surface, such as a metal surface. In some embodiments the first surface comprises an inorganic dielectric surface, such as low-k material, while the second surface comprises a metallic surface, such as an elemental metal or metal alloy. Examples of low-k material include silicon oxide-based materials, including grown or deposited silicon dioxide, doped and/or porous oxides, native oxide on silicon, etc. In some embodiments, area selective deposition of a dielectric is conducted using a PEALD process that includes one or more plasma treatment and/or etch steps that preferentially remove material grown laterally over a neighboring metal surface. In some embodiments a wet etch, such as in dilute HF, and/or a dry etch may be utilized in the process to remove SiOC from adjacent metal surfaces and obtain a desired structure.

In some embodiments SiOC is selectively deposited on a dielectric surface of a substrate relative to a different surface of the substrate, such as a metal surface. For example, SiOC may be preferentially deposited on dielectrics like $SiO_2$ or SiN relative to metals like TiN, W, Co, Cu, or Ru. In some embodiments the area selective PEALD deposition process can be a SiOC deposition process using (3-methoxypropyl)trimethoxysilane (MPTMS) as a silicon precursor and a hydrogen plasma reactant. The deposition conditions may be selected such that the top surface of the SiOC has a lower etch rate than the SiOC on the sidewalls. For example, the plasma used in the reaction with the silicon precursor may be anisotropic and can result in inhomogeneous characteristics of the deposited material. The wet etch rate of SiO2, SiN or SiOC in diluted HF is known to be very sensitive to e.g. the density of the material and the hydrogen impurity content in the material, which depend on how direct the grown material is exposed to the plasm ions. The top surface is directly exposed to the ions of the incoming plasma, while the material at the sidewall is more indirectly exposed to the plasma. Thus, the plasma used to react with the silicon precursor to form SiOC can be tuned in such a way that the top surface of the deposited SiOC has a low wet etch rate, while material on the sidewall has a higher wet etch rate.

Figure 2A:
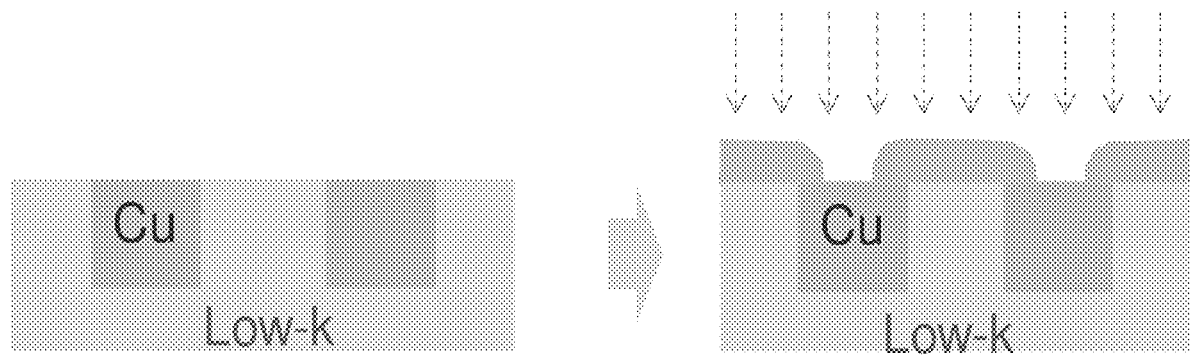
FIG. 2A and FIG. 2B show a flow diagram utilizing schematic cross sections of a portion of a substrate having first and second surfaces of low-k material and copper, and generally illustrate an area selective deposition according to some embodiments utilizing a plasma treatment and subsequent etch to remove overhangs on the copper surface.
Figure 2B:
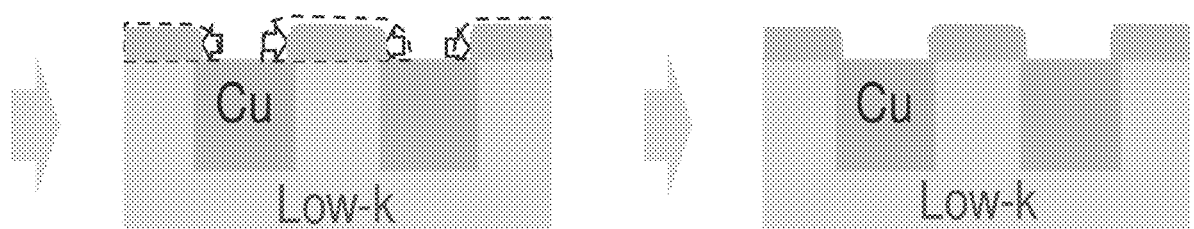

The material at the side of the overhang on the metal surface, also referred to as the "mushroom" shape is less directly exposed to the incoming plasma and as a result, the portion of the film that overhangs the metal surface will generally have a higher etch rate than the portion of the film overlying the dielectric material. This characteristic can be used to etch and reshape the area selectively grown material by preferentially etching away the material that is grown laterally over the neighboring metal surface, as is depicted in FIG. 2B. The deposition process may include a plasma treatment that removes material preferentially from an overhanging portion on the metal surface. The deposition process may also include an etching process, such as a diluted wet etch, and/or a dry or plasma etch to remove deposited SiOC from over the metal surface. The entire process can be performed in a cyclic manner, repeating several deposition and etch cycles. The result is a structure with a minimal amount of lateral growth over the neighboring metal surfaces, as illustrated in FIG. 2B.

The PEALD processes for selectively forming a SiOC film on a dielectric surface relative to a metal surface may be used in a variety of applications. In some embodiments the processes are used in various back end of line (BEOL) or middle-of-line (MOL) applications. For example, a PEALD process as described herein may be used in the formation of low-k dielectric layers on top of existing dielectric material in the formation of a back end of line (BEOL) structure.

According to some embodiments methods for selectively forming SiOC films on dielectric or low-k surface relative to metal surfaces are provided. In some embodiments SiOC on the metal surface is reduced relative to SiOC on the dielectric surface or avoided completely. In some embodiments SiOC thin films are formed on a first dielectric surface of a substrate relative to a second metal surface by plasma-enhanced atomic layer deposition (PEALD) processes. In some embodiments SiOC thin films are not deposited by liquid phase methods. According to some embodiments methods for selectively forming SiOC films on a first surface relative to a second surface, wherein the first and second surfaces are different from each other, are provided.

The formula of the silicon oxycarbide films is generally referred to herein as SiOC for convenience and simplicity. As used herein, SiOC is not intended to limit, restrict, or define the bonding or chemical state, for example the oxidation state of any of Si, O, C, and/or any other element in the film. Further, in some embodiments SiOC thin films may comprise one or more elements in addition to Si, O, and/or C, such as S. In some embodiments the SiOC films may comprise Si—C bonds and/or Si—O bonds. In some embodiments the SiOC films may comprise Si—C bonds and Si—O bonds and may not comprise Si—N bonds. In some embodiments the SiOC films may comprise Si—S bonds in addition to Si—C and/or Si—O bonds. In some embodiments the SiOC films may comprise more Si—O bonds than Si—C bonds, for example a ratio of Si—O bonds to Si—C bonds may be from about 1:1 to about 10:1. In some embodiments the SiOC may comprise from about 0% to about 40% carbon on an atomic basis. In some embodiments the SiOC may comprise from about 0.1% to about 40%, from about 0.5% to about 30%, from about 1% to about 30%, or from about 5% to about 20% carbon on an atomic basis. In some embodiments the SiOC films may comprise from about 0% to about 70% oxygen on an atomic basis. In some embodiments the SiOC may comprise from about 10% to about 70%, from about 15% to about 50%, or from about 20% to about 40% oxygen on an atomic basis. In some embodiments the SiOC films may comprise about 0% to about 50% silicon on an atomic basis. In some embodiments the SiOC may comprise from about 10% to about 50%, from about 15% to about 40%, or from about 20% to about 35% silicon on an atomic basis. In some embodiments the SiOC may comprise from about 0.1% to about 40%, from about 0.5% to about 30%, from about 1% to about 30%, or from about 5% to about 20% sulfur on an atomic basis. In some embodiments the SiOC films may not comprise nitrogen. In some other embodiments the SiOC films may comprise from about 0% to about 5% nitrogen on an atomic basis (at %).

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments, excess reactants and/or reactant byproducts are removed from the reaction space by purging, for example with an inert gas.

In some embodiments, plasma enhanced ALD (PEALD) processes are used to selectively form SiOC films on a dielectric surface relative to a metal surface. Selectivity of deposition on a first surface A relative to second surface B can be given as a percentage calculated by [(deposition on surface A)−(deposition on surface B)]/(deposition on the surface A). Deposition can be measured in any of a variety of ways known in the art or as described herein. For example, deposition may be given as the measured thickness of the deposited material or may be given as the measured amount of material deposited. In some embodiments selectivity of formation of SiOC on a first surface relative to a second surface, such as on a dielectric surface relative to a metal surface is >20%, >25%, >50%, >80%, >90%, >93%, >95%, >97%, >98%, or even greater than >99%.

The deposition process may include the use of plasma to form the SiOC, as well as a plasma treatment and subsequent etch treatment to remove SiOC that has been formed on the metal surface and thereby enhance the selectivity. The plasma conditions in the deposition process may be selected to achieve a desired etch selectivity in the deposited SiOC and to facilitate the removal of SiOC that has undesirably formed on the metal surface.

Figure 3:
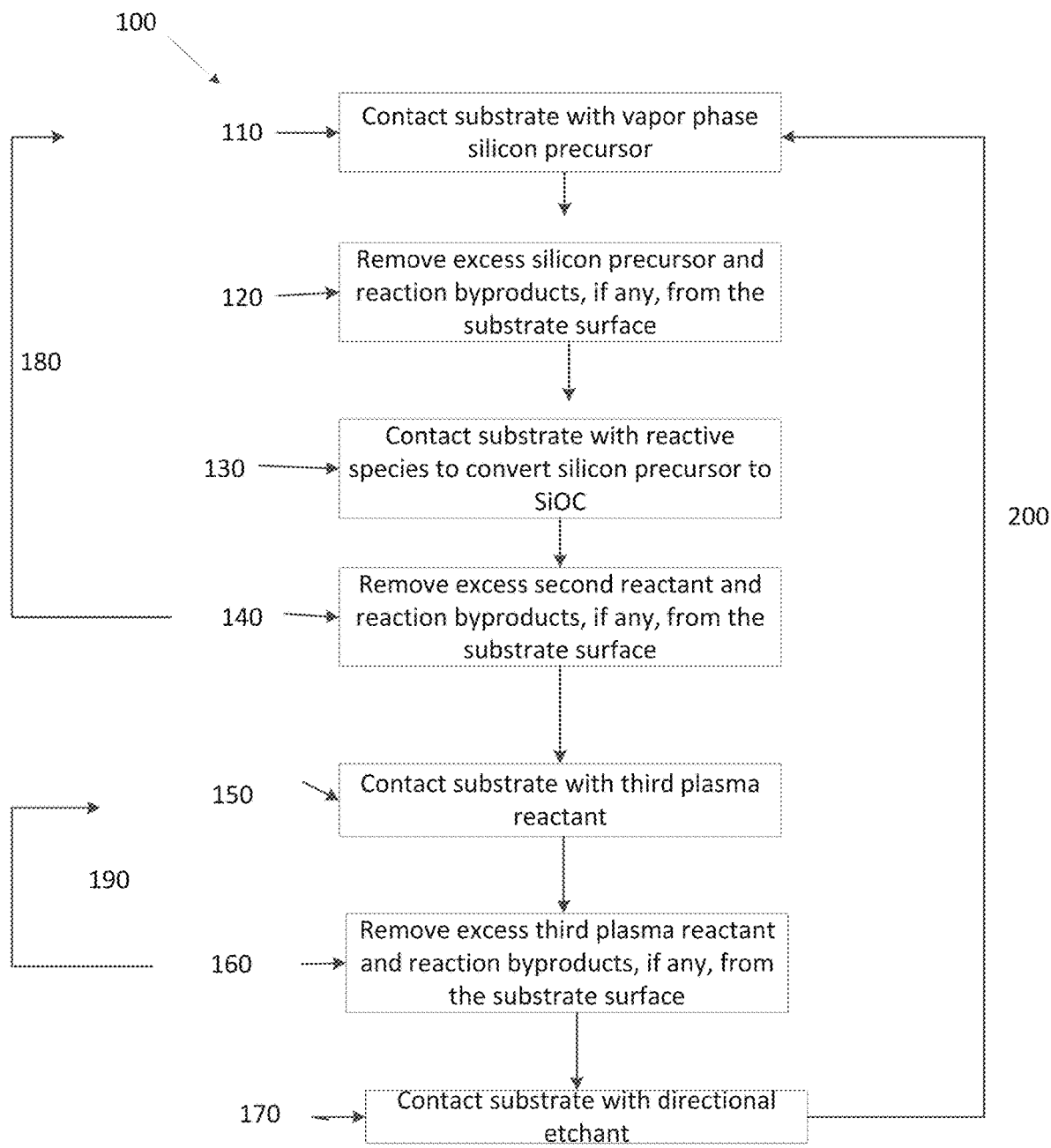
FIG. 3 is a flow diagram illustrating a process flow for selectively forming a SiOC film on a dielectric surface relative to a metal surface according to some embodiments utilizing a plasma treatment and subsequent etch to remove overhanging material from the metal surface.

In some embodiments, thin SiOC films are selectively formed on the dielectric surface of a substrate relative to a metal surface by repetition of a PEALD cycle. In some embodiments for forming SiOC films, each PEALD cycle comprises at least four distinct phases. An exemplary cycle 100 for selectively forming SiOC on a dielectric surface relative to a metal surface is illustrated in FIG. 3. Briefly, a substrate or workpiece comprising a dielectric surface and a metal surface is placed in a reaction chamber and subjected to alternately repeated surface reactions. In a first phase (110, 120), a vapor phase first reactant or precursor comprising silicon contacts the substrate 110 and forms no more than about one monolayer of silicon species on the substrate surface. This reactant is also referred to herein as "the silicon precursor," "silicon-containing precursor," or "silicon reactant" and may be, for example, a silicon precursor comprising organic ligands or a silicon precursor comprising Si—O bonds. In some embodiments the silicon precursor comprises 3-methoxypropyltrimethoxysilane (MPTMS) or bis(triethoxysilyl)ethane (BTESE). The deposition conditions, such as the temperature, are selected such that species of the first reactant adsorb preferentially on the dielectric surface of the substrate relative to the metal surface.

The first silicon reactant pulse can be supplied in gaseous form. The silicon precursor gas is considered "volatile" for purposes of the present description if the species exhibits sufficient vapor pressure under the process conditions to transport the species to the substrate surface in sufficient concentration to saturate exposed surfaces.

In some embodiments the silicon reactant contacts the substrate surface for about 0.05 seconds to about 5.0 seconds, about 0.1 seconds to about 3 seconds or about 0.2 seconds to about 1.0 seconds. The optimum contacting time can be determined by the skilled artisan based on the particular circumstances.

In some embodiments excess first vapor phase reactant and any reaction byproducts are subsequently removed from the proximity of the substrate surface 120. The first vapor phase reactant and any reaction byproducts may be removed from proximity with the substrate surface with the aid of a purge gas and/or vacuum. In some embodiments, excess reactant and/or reactant byproducts are removed from the reaction space by purging, for example with an inert gas. The removal may, in some embodiments, be carried out for about 0.1 seconds to about 10 seconds, about 0.1 seconds to about 4 seconds or about 0.1 seconds to about 0.5 seconds. In some embodiments the substrate may be moved in order to facilitate removal of the reactant and/or reactant byproducts from the vicinity of the substrate surface, for example by moving the substrate to a different reaction chamber or a separate portion of the reaction chamber.

In a second phase (130, 140), a second reactant comprising a reactive species from a plasma contacts the substrate and converts adsorbed silicon species to SiOC 130, such that SiOC is preferentially deposited on the dielectric surface relative to the metal surface. Some deposition may, however, occur on the metal surface, for example as illustrated schematically in FIG. 1A. The first phase and second phase (110, 120, 130, 140) may together be referred to as the SiOC deposition portion of the overall cycle 100.

The second reactant may comprise a hydrogen precursor and may comprise a reactive hydrogen species. In some embodiments a reactive species includes, but is not limited to, radicals, plasmas, and/or excited atoms or species. Such reactive species may be generated by, for example, plasma discharge, hot-wire, or other suitable methods. In some embodiments the reactive species may be generated remotely from the reaction chamber, for example up-stream from the reaction chamber ("remote plasma"). In some embodiments the reactive species may be generated in the reaction chamber, in the direct vicinity of the substrate, or directly above the substrate ("direct plasma").

The second reactant may comprise other species that are not hydrogen species. In some embodiments, the second reactant may comprise reactive species from a noble gas, such as one or more of He, Ne, Ar, Kr, or Xe, for example as radicals, in plasma form, or in elemental form. In some embodiments the second reactant comprises reactive species from an Ar plasma. These reactive species from noble gases do not necessarily contribute material to the deposited film but can in some circumstances contribute to film growth as well as help in the formation and ignition of plasma.

In some embodiments the substrate is contacted with a reactant comprising $H_2$ and Ar plasma. The plasma, such as hydrogen and argon plasma may be formed by generating a plasma in a reactant gas, such as hydrogen and argon gas, in the reaction chamber or upstream of the reaction chamber, for example by flowing the hydrogen ($H_2$) and Ar through a remote plasma generator.

In some embodiments one or more gases that are used to form a plasma may flow constantly throughout the deposition process but only be activated intermittently. For example, $H_2$ and/or Ar gas may flow continuously throughout the deposition process. In some embodiments the gas may serve as a carrier gas for the silicon reactant and as a plasma reactant.

In some embodiments, the second reactant comprises plasma generated in flowing $H_2$ and Ar gas. In some embodiments $H_2$ and Ar containing gas is provided to the reaction chamber before the plasma is ignited. In some embodiments the $H_2$ and Ar gas is provided to the reaction chamber continuously and hydrogen and argon containing plasma is created or supplied when needed. In some embodiments also in addition to $H_2$ and/or Ar, $N_2$ is provided to the reaction chamber before the plasma is ignited. In some embodiments also only $N_2$ is provided to the reaction chamber before the plasma is ignited.

In some embodiments the second reactant may be generated from a gas containing more than about 1 atomic % (at %) hydrogen, more than about 10 atomic % (at %) hydrogen more than about 25 atomic % (at %) hydrogen, more than about 25 atomic % (at %) hydrogen, more than about 50 at % hydrogen, more than about 75 at % hydrogen, more than about 85 at % hydrogen, more than about 90 at % hydrogen, more than about 95 at % hydrogen, more than about 96 at %, 97 at %, 98 at %, or more than about 99 at % hydrogen.

In some embodiments the second reactant may be generated from a gas containing more than about 1 atomic % (at %) argon, more than about 10 atomic % (at %) argon more than about 25 atomic % (at %) argon, more than about 25 atomic % (at %) argon, more than about 50 at % argon, more than about 75 at % argon, more than about 85 at % argon, more than about 90 at % argon, more than about 95 at % argon, more than about 96 at %, 97 at %, 98 at %, or more than about 99 at % argon.

Typically, the second reactant, for example hydrogen and argon plasma, contacts the substrate for about 0.1 seconds to about 10 seconds. In some embodiments the second reactant, such as hydrogen and argon plasma, contacts the substrate for about 0.1 seconds to about 10 seconds, 0.5 seconds to about 5 seconds or 0.5 seconds to about 2.0 seconds. However, depending on the reactor type, substrate type and its surface area, the second reactant contacting time may be even higher than about 10 seconds. In some embodiments, contacting times can be on the order of minutes. The optimum contacting time can be readily determined by the skilled artisan based on the particular circumstances.

In some embodiments the second reactant is provided in two or more distinct pulses, without introducing another reactant in between any of the two or more pulses. For example, in some embodiments a plasma, such as a hydrogen and argon plasma, is provided in two or more sequential pulses, without introducing a Si-precursor in between the sequential pulses. In some embodiments two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

In some embodiments a gas that is used to form a plasma does not comprise oxygen. In some embodiments the adsorbed silicon precursor is not contacted with a reactive species generated by a plasma from oxygen. In some embodiments a second reactant comprising reactive species is generated in a gas that does not comprise oxygen. For example, in some embodiments a second reactant may comprise a plasma generated in a gas that does not comprise oxygen. In some embodiments the second reactant may be generated in a gas comprising less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen.

In some embodiments a gas that is used to form a plasma does not comprise nitrogen. In some embodiments the adsorbed silicon precursor is not contacted with a reactive species generated by a plasma from nitrogen. In some embodiments a second reactant comprising reactive species is generated in a gas that does not comprise nitrogen. For example, in some embodiments a second reactant may comprise a plasma generated in a gas that does not comprise nitrogen. However, in some embodiments a gas that is used to form a plasma may comprise nitrogen. In some other embodiments the second reactant may comprise nitrogen radicals, nitrogen atoms and/or nitrogen plasma. In some embodiments the second reactant may be generated in a gas comprising less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments the second reactant may be generated in a gas comprising hydrogen and nitrogen, for example the second reactant may comprise $H_2$ and $N_2$. In some embodiments the second reactant may be generated in a gas having a ratio of $N_2$ to $H_2$ ($N_2/H_2$) of less than about 20%, less than about 10%, or less than about 5%.

In some embodiments a gas that is used to form a plasma does not comprise nitrogen or oxygen. In some embodiments the adsorbed silicon precursor is not contacted with a reactive species generated by a plasma from nitrogen or oxygen. In some embodiments a second reactant comprising reactive species is generated in a gas that does not comprise nitrogen or oxygen. For example, in some embodiments a second reactant may comprise a plasma generated in a gas that does not comprise nitrogen or oxygen.

In some embodiments the plasma is anisotropic. In some embodiments the plasma power, composition and reaction parameters are tuned such that the SiOC is deposited selectively on the dielectric surface relative to the metal surface and has desired etch rate characteristics. In particular, in some embodiments SiOC deposited on a dielectric surface has different characteristics from SiOC that may be deposited on metal surfaces. For example, SiOC that is selectively deposited on a dielectric surface may have higher density and lower etch rates than SiOC that is deposited on a metal surface during the same deposition process. In some embodiments horizontal or top surfaces of a deposited SiOC film have a lower etch rate, such as a lower wet etch rate in dilute HF, than the non-horizontal or sidewall surface of the same SiOC film. As discussed herein, these differential properties can be used to preferentially etch SiOC from the metal surface and create a desired deposition profile.

In some embodiments, the second reactant may be free or substantially free of oxygen-containing species (e.g., oxygen ions, radicals, atomic oxygen). In some embodiments, the second reactant does not comprise any species generated from nitrogen.

In some embodiments the plasma power, plasma composition and/or the temperature of the susceptor is tuned to achieve desired selectivity and desired etch rate characteristics in the deposited SiOC film.

In some embodiments the plasma power is tuned to achieve selective deposition of SiOC on a dielectric surface relative to a metal surface. In some embodiments the plasma power is tuned such that SiOC deposited on the metal surface has a higher etch rate than the SiOC deposited on the dielectric surface. In some embodiments, a plasma power used for generating a second reactant plasma can be about 5 Watts (W) to about 5000 W, 10 W to about 2,000 W, about 50 W to about 1000 W, about 100 W to about 1000 W or about 100 W to about 500 W. In some embodiments, a plasma power can be about 100 W to about 300 W.

In some embodiments the temperature of the susceptor supporting the substrate may be selected to achieve the desired selective deposition of SiOC on a dielectric surface relative to a metal surface and to achieve the desired etch rate characteristics in the SiOC on the different surfaces. In some embodiments the temperature is selected such that SiOC that is formed on a dielectric surface has a lower etch rate than SiOC that is formed on a metal surface by the same process. In some embodiments the susceptor temperature is from about 20 to about 700 C, from about 50 to about 600 C, from about 100 to about 550 C or from about 200 to 500 C.

In some embodiments the amount of each of $H_2$ and Ar in the gas in which the plasma is generated is selected to achieve the desired selectivity and etch rate characteristics in the SiOC. In some embodiments the H/R ratio is less than 1:1 but not 0:1, less than about 1:2 but not 0:1, less than about 1:5 but not 0:1, less than about 1:10 but not 0:1 or less than about 1:20, but not 0:1.

In some embodiments excess second reactant and any reaction byproducts are removed 140 from the proximity of the substrate surface. The second reactant and any reaction byproducts may be removed from proximity with the substrate surface with the aid of a purge gas and/or vacuum. In some embodiments, excess reactant and/or reactant byproducts are removed from the reaction space by purging, for example with an inert gas. The removal may, in some embodiments, be carried out for about 0.1 seconds to about 10 seconds, about 0.1 seconds to about 4 seconds or about 0.1 seconds to about 0.5 seconds. In some embodiments the substrate may be moved in order to facilitate removal of the reactant and/or reactant byproducts, for example by moving the substrate to a different reaction chamber or a separate portion of the reaction chamber.

The first and second phases (110, 120, 130, 140), the SiOC deposition portion of the deposition cycle, may be repeated 180 one, two or more times consecutively prior to beginning the third (150, 160) and/or fourth (170) phase of the entire SiOC formation cycle 100. For example, the first and second phases may be repeated until a SiOC layer of a desired thickness has been formed on the dielectric surface.

While the SiOC deposition is selective on the dielectric or low-k surface relative to the metal surface, in some embodiments overhangs of SiOC may be present on the metal surface. This is illustrated in FIG. 2A, which shows the deposition of SiOC on a low-k material relative to copper, with the formation of overhangs of SiOC on the copper surface. The overhangs may be reduced or eliminated by including the third and/or fourth phases, as described below, in one or more deposition cycles.

Although referred to as the first phase and second phase, in some embodiments for forming a SiOC film, one or more SiOC deposition cycles 100 begins with the first phase by contacting the substrate with the silicon precursor, followed by the second precursor. In other embodiments one or more SiOC deposition cycles 100 may begin with the second phase by contacting the substrate with the second reactant, followed by the silicon precursor.

In a third phase (150, 160), the substrate may be contacted 150 with a reactant comprising a plasma. For example, the substrate may be contacted with a plasma generated in a noble gas, such as Ar plasma. In some embodiments the plasma is directional, and preferentially attacks SiOC that has been formed on the metal surface relative to SiOC that has been formed on the dielectric surface. This is illustrated in the right-hand panel of FIG. 2A, where the arrows represent the plasma treatment of the surfaces.

Plasma power and duration can be tuned to increase the preferential targeting of the SiOC overhangs on the metal surface. In some embodiments the third phase preferentially removes SiOC from the metal surface relative to the dielectric surface.

In some embodiments excess third reactant and reaction byproducts may be removed from the proximity of the substrate surface 160, such as with the aid of a purge gas and/or vacuum, or by moving the substrate to a different reaction chamber or a separate portion of the reaction chamber. The removal may, in some embodiments, be carried out for about 0.1 seconds to about 10 seconds, about 0.1 seconds to about 4 seconds or about 0.1 seconds to about 0.5 seconds. The third phase may be repeated 190 two or more times in each complete deposition cycle 100. In some embodiments the third phase may be included in each deposition cycle. In some embodiments the third phase is not included in every deposition cycle but is provided one or more times in the deposition process.

An optional fourth phase (170) may be included to further etch SiOC from the metal surface, for example if it is not removed to a desired extent in the third phase. In the fourth phase, the substrate is contacted with an etchant 170 to preferentially remove SiOC from over the metal surface relative to the dielectric surface. This is illustrated in FIG. 2B, which shows the preferential etching of the overhangs relative to the top surface of the deposited SiOC film. In some embodiments the etchant is directional. The fourth phase may be included in the SiOC formation cycle 100, for example, if the plasma treatment in the third phase is not sufficient to achieve the desired level of removal of SiOC overhangs from the metal surface. The fourth phase may be included in every cycle 100. In some embodiments the fourth phase is not included in every cycle 100 but is provided one or more times in the SiOC deposition process. For example, the fourth phase may be included after a certain number of repetitions of a cycle that includes only the first three phases, such as after every one, two, three, four, five or more such deposition cycles.

In some embodiments the etchant may be a reactive gas, such as a reactive halide gas such as $CF_4$, $SF_6$, HF, $Cl_2$ or $NF_3$. In some embodiments a wet etch is used to preferentially remove the SiOC overhangs from the metal surface. For example, etching in dilute HF may be used to preferentially remove SiOC from the metal surface. The etchant preferentially removes SiOC from the metal surface, leaving a desired SiOC structure on the dielectric surface, for example as illustrated in FIG. 2B.

In some embodiments, the etchant may comprise, for example, a plasma generated in a halide gas such as $CF_4$, $SF_6$, HF, $Cl_2$ or $NF_3$. The plasma power and time may be selected to achieve the desired amount of etching. The etching plasma may be directional. The etching plasma preferentially attacks the SiOC on the metal surface relative to the bulk portion of the SiOC deposited on the dielectric surface, leaving a desired structure as illustrated in FIG. 2B.

Additional phases may be added and phases may be removed as desired to adjust the composition and selectivity of the SiOC film.

The entire SiOC formation cycle may be repeated 200 two, three or more times to achieve a desired amount of SiOC on the metal surface relative to the dielectric surface.

In some embodiments, two of the phases may overlap, or be combined. For example, the silicon precursor and the second reactant may contact the substrate simultaneously in phases that partially or completely overlap. In addition, the order of the phases may be varied, and an ALD cycle may begin with any one of the phases. That is, unless specified otherwise, the reactants can contact the substrate in any order, and the process may begin with any of the reactants.

A complete PEALD cycle according to some embodiments may be written as:

[Si reactant+Ar/$H_2$ plasma]×N+[Ar plasma]×M+ [Etchant]×Y, where N, M and Y are integers that can be selected independently. In some embodiments any of N, M and Y may be zero in one or more deposition cycles in a complete deposition process.

The selective SiOC deposition takes place on a substrate in a reaction space or reactor. In some embodiments each of the four phases takes place in the same reaction space and/or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space-divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates may be in the range of 10 to 200, in the range of 50 to 150, or in the range of 100 to 130.

In some embodiments, if necessary, the exposed surfaces of the substrate can be pretreated to provide reactive sites to react with the first phase of the ALD process. In some embodiments a separate pretreatment step is not required. In some embodiments the substrate is pretreated to provide a desired surface termination on one or more surfaces. For example, the substrate may be treated to provide surface terminations on the dielectric surface to enhance selectivity. In some embodiments the substrate may be treated to provide a blocking or passivation layer on the metal surface to increase selectivity of the deposition on the dielectric surface.

As mentioned above, in some embodiments a gas is provided to the reaction chamber continuously during one or more phases of the deposition cycle, or during the entire deposition cycle, or even throughout the entire deposition process. Reactive species may be provided by generating a plasma in a gas, either in the reaction chamber or upstream of the reaction chamber. In some embodiments the gas does not comprise nitrogen. In some embodiments the gas may comprise a noble gas, such as argon or helium. In some embodiments the gas is argon. The flowing gas may also serve as a purge gas. For example, flowing argon may serve as a purge gas for a first silicon precursor and also serve as a source of reactive species second reactant and a third reactant (as a source of reactive species). In some embodiments, argon may serve as a purge gas for a first precursor and a source of excited species for converting the silicon precursor to the SiOC film and as the source of reactive species for a plasma treatment, such as in the second and third phases described above.

In some embodiments the deposition parameters, such as the precursor flow rate, contacting time, removal time, reactants themselves, plasma power, reaction chamber temperature and susceptor temperature may be selected in order to selectively form a SiOC film with the desired characteristics on a dielectric surface relative to a metal surface. In particular, one or more of these parameters may be selected to reduce, minimize or prevent deposition of SiOC on a metal surface of the substrate and/or to preferentially remove SiOC from the metal surface.

In some embodiments plasma, for example hydrogen and argon containing plasma, argon plasma, or etching plasma may be generated by applying RF power of from about 5 W to about 5000 W, 10 W to about 2000 W, from about 50 W to about 1000 W, or from about 200 W to about 800 W. In some embodiments the RF power density may be from about 0.02 W/cm$^2$ to about 2.0 W/cm$^2$, or from about 0.05 W/cm$^2$ to about 1.5 W/cm$^2$. The RF power may be applied to a reactant gas that flows during the plasma contacting time, that flows continuously through the reaction chamber, and/or that flows through a remote plasma generator. Thus, in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.1 cm to about 20 cm, from about 0.5 cm to about 5 cm, or from about 0.8 cm to about 3.0 cm.

According to some embodiments, the PEALD reactions may be performed at temperatures ranging from about 25° C. to about 700° C., from about 50° C. to about 600° C., from about 100° C. to about 450° C., or from about 200° C. to about 400° C. In some embodiments, the optimum reactor temperature may be limited by the maximum allowed thermal budget. Therefore, in some embodiments the reaction temperature is from about 100° C. to about 300° C. In some applications, the maximum temperature is around about 200° C., and, therefore the PEALD process is run at that reaction temperature. In some embodiments the susceptor temperature is the same as the reaction space temperature. In some embodiments the susceptor temperature is within 100 C or within 50 C of the reaction space temperature.

According to some embodiments of the present disclosure, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr. In some embodiments, a SiOC deposition process can be performed at a pressure of about 20 Torr to about 500 Torr, about 20 Torr to about 50 Torr, or about 20 Torr to about 30 Torr.

In some embodiments a SiOC deposition process can comprise a plurality of deposition cycles, wherein at least one deposition cycle is performed in an elevated pressure regime. For example, a deposition cycle of a PEALD process may comprise alternately and sequentially contacting the substrate with a silicon precursor and a second reactant under the elevated pressure. In some embodiments, one or more deposition cycles of the PEALD process can be performed at a process pressure of about 6 Torr to about 500 Torr, about 6 Torr to about 50 Torr, or about 6 Torr to about 100 Torr. In some embodiments, the one or more deposition cycles can be performed at a process pressure of greater than about 20 Torr, including about 20 Torr to about 500 Torr, about 30 Torr to about 500 Torr, about 40 Torr to about 500 Torr, or about 50 Torr to about 500 Torr. In some embodiments, the one or more deposition cycles can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

Figure 4:
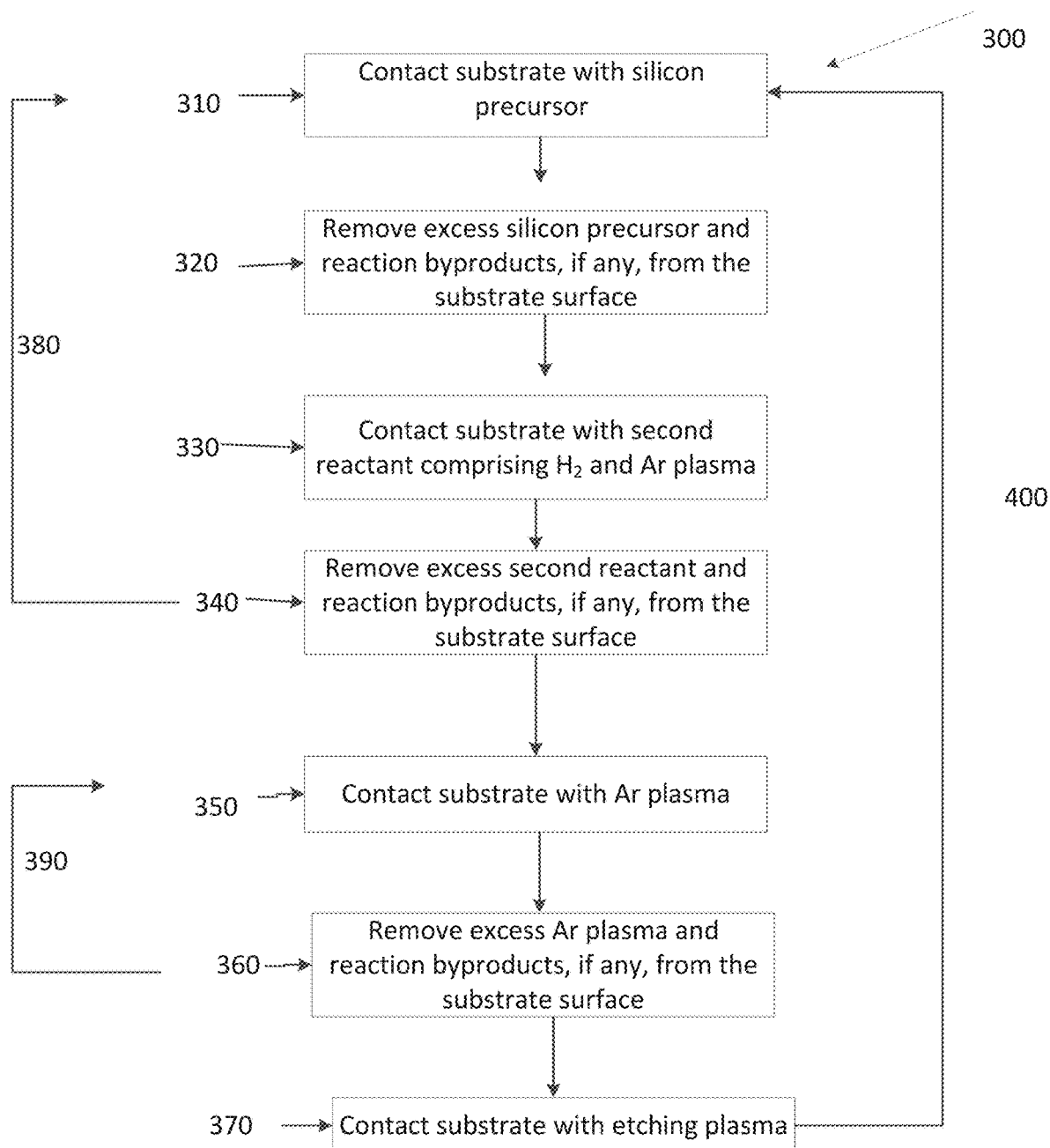
FIG. 4 is a flow diagram illustrating a process flow for selectively forming a SiOC film on a dielectric surface relative to a metal surface according to some embodiments utilizing a plasma treatment and subsequent etch to remove overhanging material from the metal surface.

Referring to FIG. 4 and according to some embodiments a SiOC thin film is selectively deposited on a dielectric surface relative to a metal surface on a substrate in a reaction space by a PEALD process 300 comprising at least one cycle comprising:

contacting the substrate with a vapor phase silicon-containing precursor comprising MPTMS at step 310 such that silicon species adsorb onto the surface of the substrate;

removing excess silicon-containing precursor and reaction byproducts, if any, from the substrate surface at step 320;

contacting the substrate with a second reactant comprising H$_2$ and Ar plasma at step 330, thereby converting the adsorbed silicon species into SiOC;

removing excess second reactant and reaction byproducts, if any, from the substrate surface at step 340; and optionally repeating the contacting and removing steps at step 380 to form a SiOC thin film of a desired thickness and composition.

With continued reference to FIG. 4, the deposited SiOC is treated by contacting it with an Ar plasma at step 350. The Ar plasma may preferentially remove SiOC from the metal surface and may also make the SiOC over the metal surface more susceptible to a subsequent etching process. Excess Ar plasma and reaction byproducts, if any, may be removed from the substrate surface at step 360, for example by shutting off the plasma power and continuing to flow the Ar gas. The Ar plasma treatment may be repeated 390 one, two or more times in sequence. The plasma treatment step 350 may be included in each deposition cycle or may be provided intermittently in one or more deposition cycles.

In an optional etching process 370, the substrate may be contacted with an etchant such as a plasma generated in a halide gas. The etching process may remove additional SiOC preferentially from over the metal surface relative to the dielectric surface. The etching process 370 may be included in every deposition cycle 300 or intermittently in one or more deposition cycles.

The deposition cycle 300 is repeated 400 one, two or more times to selectively form a SiOC layer on the dielectric surface relative to the metal surface.

A number of different suitable Si precursors can be used in the presently disclosed PEALD processes. In some embodiments the suitable Si precursors may not comprise nitrogen. In some embodiments a suitable Si precursor may comprise MPTMS. In some embodiments the silicon precursor is a silicon precursor as described in U.S. patent application Ser. No. 15/588,026, filed May 5, 2017, which is hereby incorporated by reference in its entirety.

In some embodiments more than one silicon precursor may contact the substrate surface at the same time during an ALD phase. In some embodiments the silicon precursor may comprise more than one of the silicon precursors described herein. In some embodiments a first silicon precursor is used in a first ALD cycle and a second, different silicon precursor is used in a later ALD cycle. In some embodiments multiple silicon precursors may be used during a single ALD phase, for example in order to optimize certain properties of the deposited SiOC film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent. In some embodiments the deposition temperature and/or the duration of the silicon precursor contacting step are selected such that the silicon precursor does not decompose. In some embodiments the silicon precursor may decompose during the silicon precursor contacting step. In some embodiments the silicon precursor does not comprise a halogen, such as chlorine or fluorine.

In some embodiments, SiOC films are deposited to a thickness of from about 3 nm to about 50 nm, from about 5 nm to about 30 nm, from about 5 nm to about 20 nm. These thicknesses can be achieved in feature sizes (width) below about 100 nm, about 50 nm, below about 30 nm, below about 20 nm, and in some cases below about 15 nm. According to some embodiments, a SiOC film is deposited on a three-dimensional structure and the thickness at a sidewall may be slightly even more than 10 nm. In some embodiments SiOC films of greater than 50 nm can be deposited. In some embodiments SiOC films of greater than 100 nm can be deposited. In some embodiments, SiOC films are deposited to a thickness of more than about 1 nm, more than about 2 nm, more than about 3 nm, more than about 5 nm, more than about 10 nm.

According to some embodiments SiOC films with differential wet etch rates (WER) may be deposited. In some embodiments, SiOC formed according to one or more processes described herein can advantageously demonstrate a ratio of a WER of a substantially vertical region to a WER of a substantially horizontal region of about 1, for example in 0.5 wt % dHF. For example, a ratio of a wet etch rate of a SiOC thin film formed over substantially vertical surfaces (e.g., sidewall surfaces) to a wet etch rate of the SiOC thin film formed over substantially horizontal surfaces (e.g., top surfaces) of three-dimensional structures on a substrate surface can be the same or substantially the same. In some embodiments, the ratio can be about 4 to about 0.5, about 2 to about 0.75, about 1.25 to about 0.8, or about 1.1 to about 0.9. These ratios can be achieved in features with aspect ratios of about 2 or more, about 3 or more, about 5 or more or even about 8 or more.

In some embodiments the deposited SiOC thin film may contain up to about 40% carbon on an atomic basis (at %). In some embodiments a SiOC film may comprise carbon from about 0.1% to about 40%, from about 0.5% to about 40%, from about 1% to about 30%, or from about 5% to about 20% on an atomic basis. In some embodiments a SiOC film may comprise at least about 1%, about 10% or about 20% carbon on an atomic basis.

In some embodiments the deposited SiOC thin film may contain up to about 50% silicon on an atomic basis (at %). In some embodiments a SiOC film may comprise silicon from about 10% to about 50%, from about 15% to about 40%, or from about 20% to about 35% on an atomic basis. In some embodiments a SiOC film may comprise at least about 15%, about 20%, about 25% or about 30% silicon on an atomic basis.

In some embodiments the deposited SiOC thin film may contain up to about 40% sulfur on an atomic basis (at %). In some embodiments a SiOC film may comprise sulfur from about 0.01% to about 40%, from about 0.1% to about 40%, from about 0.5% to about 30%, or from about 1% to about 20% on an atomic basis. In some embodiments a SiOC film may comprise at least about 1%, about 10% or about 20% sulfur on an atomic basis. In some embodiments, the deposited SiOC films do not comprise an appreciable amount of nitrogen. However, in some embodiments a SiOC film comprising nitrogen is deposited. In some embodiments, the deposited SiOC films comprises less than about 30 at %, less than about 20 at %, less than about 15 at %, less than about 10 at %, less than about 5 at % of nitrogen, less than about 1 at % nitrogen, or less than about 0.1 at % nitrogen. In some embodiments the SiOC thin films do not comprise nitrogen.

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, less than about 10 at % or less than about 5 at %. In some embodiments the deposited SiOC thin film may contain up to about 70% oxygen on an atomic basis (at %). In some embodiments a SiOC film may comprise oxygen from about 10% to about 70%, from about 15% to about 50%, or from about 20% to about 40% on an atomic basis. In some embodiments a SiOC film may comprise at least about 20%, about 40% or about 50% oxygen on an atomic basis.

In some embodiments a SiOC film may comprise one or more of SiN, SiO, SiC, SiCN, SiON, SiOSC, SiSC, SiOS, and/or SiOC. In some embodiments SiOC films deposited according to the disclosed methods do not comprise a laminate or nanolaminate structure.

In some embodiments a SiOC film is not a low-k film, for example a SiOC film is not a porous film. In some embodiments a SiOC is a continuous film. In some embodiments a SiOC film has a k-value that is less than about 10. In some embodiments a SiOC film has a k-value that is less than about 7. In some embodiments a SiOC film has a k-values from about 2 to about 10. In some embodiments a SiOC film has a k-value that is less than about 5.0, less than about 4.5, less than about 4.3, less than about 4.1. In some embodiments a SiOC film has a k-value that from about 3.0 to about 7, from about 3.0 to about 5.5, from about 3.0 to about 5.0, from about 3.5 to about 4.8, from about 3.5 to about 4.7. In some embodiments a SiOC film has a k-value that is more than the k-value of any low-k film. In some embodiments a SiOC film has a k-value that is more than pure $SiO_2$.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of selectively forming a silicon oxycarbide (SiOC) thin film on a dielectric surface of a substrate relative to a second surface of the substrate by a plasma enhanced atomic layer deposition (PEALD) process, wherein the PEALD process comprises at least one deposition cycle comprising:
- contacting the substrate with a first vapor phase silicon reactant;
- contacting the substrate with a second reactant comprising reactive species from a first plasma; and
- contacting the substrate with a second plasma that is different from the first plasma.

2. The method of claim 1, wherein the first plasma is generated in a gas that does not comprise nitrogen.

3. The method of claim 1, wherein the second plasma is generated in a noble gas.

4. The method of claim 3, wherein the noble gas is Ar gas.

5. The method of claim 1, wherein the at least one deposition cycle further comprises contacting the substrate with an etchant.

6. The method of claim 5, wherein the etchant comprises dilute HF.

7. The method of claim 5, wherein the etchant comprises a plasma generated in a halide gas.

8. The method of claim 5, wherein the etchant comprises a vapor phase halogen.

9. The method of claim 5, wherein contacting the substrate with the first vapor phase silicon reactant and contacting the substrate with the second reactant are repeated two or more times in sequence prior to contacting the substrate with the second plasma and the etchant.

10. The method of claim 1, wherein the second surface is a metal surface.

11. The method of claim 1, wherein the second surface comprises TiN, W, Co, Cu, or Ru.

12. The method of claim 1, wherein the dielectric surface comprises $SiO_2$ or SiN.

13. The method of claim 1, wherein the reactive species are from the first plasma generated in a gas that does not comprise nitrogen or oxygen.

14. The method of claim 1, wherein the second reactant comprises reactive hydrogen species.

15. The method of claim 1, wherein the first plasma is generated in a gas comprising $H_2$ and Ar.

16. The method of claim 1, wherein the first vapor phase silicon reactant comprises 3-methoxypropyltrimethoxysilane (MPTMS) or bis(triethoxysilyl)ethane (BTESE).

17. The method of claim 1, wherein the first vapor phase silicon reactant does not comprise nitrogen.

18. A method of selectively forming a silicon oxycarbide (SiOC) thin film on a dielectric surface of a substrate in a reaction space relative to a metal surface of the substrate comprising a plurality of deposition cycles, wherein at least one deposition cycle comprises:
- contacting the metal and dielectric surfaces of the substrate with a silicon precursor comprising 3-methoxypropyltrimethoxysilane (MPTMS) or bis(triethoxysilyl)ethane (BTESE);
- contacting the metal and dielectric surfaces of the substrate with a first plasma generated in a gas that does not comprise nitrogen; and
- contacting the metal and dielectric surfaces of the substrate with a second plasma generated in argon gas,
- wherein the at least one deposition cycle is repeated two or more times to form the SiOC thin film.

19. The method of claim 18, wherein the first plasma is generated in a gas comprising $H_2$ and Ar.

20. The method of claim 18, wherein the at least one deposition cycle further comprises contacting the metal and dielectric surfaces of the substrate with an etchant.

* * * * *